US011979117B2

(12) United States Patent
Sasaki

(10) Patent No.: US 11,979,117 B2
(45) Date of Patent: May 7, 2024

(54) HIGH FREQUENCY SEMICONDUCTOR AMPLIFIER

(71) Applicant: Mitsubishi Electric Corporation, Tokyo (JP)

(72) Inventor: Yoshinobu Sasaki, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 421 days.

(21) Appl. No.: 17/296,747

(22) PCT Filed: Mar. 25, 2019

(86) PCT No.: PCT/JP2019/012471
§ 371 (c)(1),
(2) Date: May 25, 2021

(87) PCT Pub. No.: WO2020/194441
PCT Pub. Date: Oct. 1, 2020

(65) Prior Publication Data
US 2022/0029591 A1    Jan. 27, 2022

(51) Int. Cl.
*H03F 3/191* (2006.01)
*H01L 27/06* (2006.01)
(Continued)

(52) U.S. Cl.
CPC ............ *H03F 3/193* (2013.01); *H01L 27/06* (2013.01); *H03F 1/26* (2013.01); *H03F 1/565* (2013.01); *H03F 3/60* (2013.01)

(58) Field of Classification Search
CPC .................................. H03F 3/191; H03F 3/187
(Continued)

(56) References Cited

U.S. PATENT DOCUMENTS 5,117,203 A * 5/1992 Tennyson ................. H03F 3/19
330/294
5,276,406 A * 1/1994 Samay .................. H03F 3/1935
330/277
(Continued)

FOREIGN PATENT DOCUMENTS

JP          2008-109227 A     5/2008
JP          2013-118329 A     6/2013
KR    10-2018-0065905 A       6/2018

OTHER PUBLICATIONS

Miwa et al., "A 67% PAE, 100 W GaN Power Amplifier with On-Chip Harmonic Tuning Circuits for C-band Space Applications", 2011 IEEE MTT-S International Microwave Symposium, May 10, 2021.
(Continued)

*Primary Examiner* — Henry Choe
(74) *Attorney, Agent, or Firm* — Studebaker & Brackett PC

(57) ABSTRACT

A high frequency semiconductor amplifier according to the present disclosure includes: a transistor formed on a semiconductor substrate and including a gate electrode, a source electrode, and a drain electrode; a matching circuit for input-side fundamental wave matching of the transistor; a first inductor formed on the semiconductor substrate and having one end connected to the gate electrode of the transistor and the other end connected to the matching circuit; a capacitor formed on the semiconductor substrate and having one end being short-circuited; and a second inductor formed on the semiconductor substrate and having one end connected to the gate electrode of the transistor and the other end connected to the other end of the capacitor, wherein the second inductor resonates in series with the capacitor at second harmonic frequency, has a mutual inductance of subtractive polarity with the first inductor, and the
(Continued)

first inductor and the second inductor form mutual inductive circuits for input-side second harmonic matching.

5 Claims, 11 Drawing Sheets

(51) Int. Cl.
    *H03F 1/26*         (2006.01)
    *H03F 1/56*         (2006.01)
    *H03F 3/193*       (2006.01)
    *H03F 3/60*         (2006.01)

(58) Field of Classification Search
    USPC .................................................. 330/302, 307
    See application file for complete search history.

(56) References Cited

U.S. PATENT DOCUMENTS

| | | | | |
|---|---|---|---|---|
| 8,076,994 | B2* | 12/2011 | Farrell | ................... H03F 3/195 |
| | | | | 333/32 |
| 8,659,359 | B2* | 2/2014 | Ladhani | ................... H03F 1/42 |
| | | | | 330/306 |
| 9,825,597 | B2* | 11/2017 | Wallis | .................. H04B 1/1607 |
| 10,079,579 | B2 | 9/2018 | Kong et al. | |
| 2002/0067212 | A1* | 6/2002 | Takenaka | ................ H03F 3/601 |
| | | | | 330/302 |
| 2008/0094141 | A1 | 4/2008 | Gotou et al. | |
| 2012/0211762 | A1 | 8/2012 | Imada et al. | |
| 2018/0167048 | A1 | 6/2018 | Kong et al. | |

OTHER PUBLICATIONS

International Search Report; Written Opinion; and Notification of Transmittal of the International Search Report and the Written Opinion of the International Searching Authority, or the Declaration issued in PCT/JP2019/012471; dated Jun. 11, 2019.

Office Action issued in TW109109161; mailed by the Taiwanese Patent Office dated Nov. 5, 2020.

An Office Action mailed by the Korean Intellectual Property Office dated Jun. 26, 2023, which corresponds to Korean Patent Application No. 10-2021-7029113 and is related to U.S. Appl. No. 17/296,747; with English language translation.

\* cited by examiner

HIGH FREQUENCY SEMICONDUCTOR AMPLIFIER

FIELD

The present disclosure relates to a high frequency semiconductor amplifier.

BACKGROUND

Power consumption reduction, that is, efficiency improvement during operation is a basic problem in a semiconductor amplifier. As one of approaches from a circuit point of view for this problem in a high frequency semiconductor amplifier that amplifies electric power with a high frequency exceeding a microwave, there is a method of achieving a high-efficiency operation through control of the impedance of a peripheral circuit expected from a semiconductor at a frequency (hereinafter, higher harmonic wave) equivalent to a multiple of a frequency (hereinafter, fundamental wave) of a signal amplified by the semiconductor, so-called higher harmonic processing. Control in a second harmonic wave equivalent to a double frequency of the fundamental wave among higher harmonic waves is particularly important.

For example, Patent Literature 1 discloses a method of achieving efficiency improvement of a high frequency semiconductor amplifier by connecting, to the vicinity of gates of a transistor on a semiconductor chip, a second harmonic resonance circuit including an MIM (Metal Insulator Metal) capacitor and an inductor configured by a transmission line and controlling an input second harmonic. When the inductor is configured by the transmission line, the inductor occupies a large area in the vicinity of electrodes of the transistor. Therefore, Non Patent Literature 1 discloses a case in which, in an actual semiconductor product, an inductor is configured by a spiral inductor to realize desired inductance in a smaller area and reduce the area of a semiconductor chip and reduce cost.

CITATION LIST

Patent Literature

[Patent Literature 1] JP 2013-118329 A

Non Patent Literature

[Non Patent Literature 1] 2011 IEEE MTT-S International Microwave Symposium, "A 67% PAE, 100 W GaN Power Amplifier with On-Chip Harmonic Tuning Circuits for C-band Space Applications"

SUMMARY

Technical Problem

An example of a conventional high frequency semiconductor amplifier to which the control technique for the input second harmonic described above is applied is shown in FIG. 9 to FIG. 14. The conventional high frequency semiconductor amplifier is a one-stage amplifier for a cellular phone base station sealed in a package 12. Note that, in the figures, components denoted by the same reference numerals and signs are the same components or components equivalent to the same components. The same applies in the entire specification.

A sectional view and a top view of the conventional high frequency semiconductor amplifier are shown in FIG. 9 and FIG. 10. FIG. 9 is a sectional view of the conventional high frequency semiconductor amplifier viewed from an arrow A in FIG. 10. FIG. 10 is a top view of the conventional high frequency semiconductor amplifier. In order to show an implementation state in a package of the conventional high frequency semiconductor amplifier, a cap 12c in FIG. 9 is not shown in FIG. 10.

As shown in FIG. 9, the package 12 is configured from a metal plate 12a, an insulator 12b, a cap 12c, and leads 10 and 14. The insulator 12b is a frame body made of ceramic and is fixed in contact with the upper surface of the metal plate 12a by brazing. The leads 10 and 14 are formed from a thin plate of a copper alloy or the like and are fixed to the upper surface of the insulator 12b by brazing. The inside of a package formed by the insulator 12b and the metal plate 12a is sealed by the cap 12c using an adhesive (not shown). The material of the cap 12c is ceramic. The lead 10 is a lead for input of high frequency power to the conventional high frequency semiconductor amplifier and functions as a gate bias terminal as well. The lead 14 is a lead for output of high frequency power amplified by the conventional high frequency semiconductor amplifier and functions as a drain bias terminal as well.

A chip T1 is a small piece of a semiconductor substrate obtained by epitaxially growing, on the upper surface of a SIC (Silicon Carbide) substrate, a semiconductor layer containing GaN (Gallium Nitride) as a main material. A transistor (not shown in FIGS. 9 and 10) including gate electrodes, source electrodes, and drain electrodes is formed on the upper surface of the chip T1. This transistor is a HEMT (High Electron Mobility Transistor) excellent in a high frequency characteristic. A chip P1 is a small piece of a semiconductor substrate, which contains GaAs as a main material, forming a part of a matching circuit (a circuit for pre-match) that matches a fundamental wave on an input side of the transistor formed on the chip T1. The chip T1 and the chip P1 are fixed to the upper surface of the metal plate 12a by a joining material (not shown) such as solder or a conductive adhesive and are electrically connected.

The metal plate 12a plays a role of a heat radiation plate that transfers heat generated by the chip T1 mounted on the upper surface of the metal plate 12a to the rear surface of the metal plate 12a. The rear surface of the metal plate 12a plays a role of a grounding terminal of the conventional high frequency semiconductor amplifier and applies ground potential to the chip T1 and the chip P1.

The lead 10 and the chip P1 are connected by wires W11 to W15. The chip P1 and the chip T1 are connected by wires W21 to W25. The chip T1 and the lead 14 are connected by wires W31 to W35. As shown in FIG. 10, the wires W11 to W15 connecting the lead 10 for input and the chip P1 are disposed substantially in parallel when viewed from the upper surface. The wires W21 to W25 connecting the chip P1 and the chip T1 are disposed substantially in parallel when viewed from the upper surface, The wires W31 to W35 connecting the chip T1 and the lead 14 for output are disposed substantially in parallel when viewed from the upper surface.

FIG. 11 is a detailed view of the inside of the conventional high frequency semiconductor amplifier viewed from the upper surface. Matching circuits MC1 to MC5 for input-side fundamental wave matching are disposed on the upper surface of the chip P1. The fundamental wave matching, circuits MC1 to MC5 include output-side bonding pads independent from one another and include, on an input side, a common wire bonding pad PP for signal input.

Transistors Tr1 to Tr5 are formed on the upper surface of the chip T1 and form a HEMT cell. Note that the HEMT cell in this specification indicates a cluster of units Tr in which gate electrodes are connected to one another in the vicinity of transistors. The transistors Tr1 to Tr5 include bonding pads connected to gate electrodes independent from one another and a common wire bonding pad TT for signal output connected to drain electrodes.

A second harmonic short circuit including inductors for second harmonic matching L1 to L5 and capacitors for second harmonic matching C1 to C5 is disposed on the upper surface of the chip T1. One ends of the inductors for second harmonic matching L1 to L5 are connected to gates of the transistors Tr1 to Tr5. The other ends of the inductors for second harmonic matching L1 to L5 are connected to one ends of the capacitors for second harmonic matching C1 to C5. The other ends of the capacitors for second harmonic matching C1 to C5 are grounded via VIAs formed in the chip T1 and connected to the rear surface of the chip TL The inductors for second harmonic matching L1 to L5 and the capacitors for second harmonic matching C1 to C5 are connected in series.

FIG. 12 is an equivalent circuit of a path leading from a connection point IN1 to a connection point OUT1 in FIG. 11. The inductor for second harmonic matching L1 and the capacitor for second harmonic matching C1 formed on the chip T1 form a second harmonic short circuit that resonates at a frequency near a second harmonic. The efficiency improvement described above is realized by setting the magnitude of a reflection coefficient of the impedance of a second harmonic expected from gates of a transistor to approximately 1 (total reflection) and appropriately setting a phase of the reflection coefficient. The total reflection is realized only when the second harmonic short circuit ideally has 0Ω through resonance. However, it should be noted that, practically, if the impedance of the second harmonic short circuit is set to ⅕ or less compared with the impedance of the fundamental wave, there is a certain or more effect for the efficiency improvement.

FIG. 13 is a diagram showing input second harmonic reflection phase dependency of drain efficiency. Drain efficiency of a power amplifier of a path leading from the connection point IN1 to the connection point OUT1 in FIG. 12 is simulated by changing a reflection phase in a state in which the magnitude of a reflection coefficient of second harmonic impedance viewed in the connection point IN1 direction from gate electrodes of the transistor Tr1 is set to approximately 1 (total reflection). However, in this simulation, the magnitude and the phase of the reflection coefficient viewed from the gate electrodes are ideally changed. The inductor for second harmonic matching L1 and the capacitor for second harmonic matching C1 in FIG. 12 are not included. The vertical axis of FIG. 13 indicates the drain efficiency of the amplifier and the horizontal axis of FIG. 13 indicates the reflection phase of the second harmonic impedance viewed on a signal source side, that is, in the connection point IN1 direction from the gate electrodes. As shown in FIG. 13, the drain efficiency of the amplifier changes according to the second harmonic reflection phase viewed from the gates. Usually, the drain efficiency shows a maximum value near 180°. In this simulation, maximum efficiency is obtained at 170° to 190°.

On the other hand, the impedance of an actual circuit has a frequency characteristic. FIG. 14 is a diagram showing a track of input-side impedance in the conventional high frequency semiconductor amplifier. Specifically, in the equivalent circuit in FIG. 12, the track is a vector track indicating frequency dependency of impedance viewed in the direction of the connection point IN1 from the gate electrodes of the transistor Tr1.

A lower limit frequency of a band of a fundamental wave to be power-amplified in the high frequency semiconductor amplifier is represented as fl, an upper limit frequency of the band of the fundamental wave is represented as fh, and a center frequency of the lower limit frequency and the upper limit frequency is represented as fc. A lower limit frequency of a second harmonic band is represented as $2fl$ (a double frequency of fl), an upper limit frequency of the second harmonic band is represented as $2fh$ (a double frequency of fh), and a center frequency of the lower limit frequency and the upper limit frequency is represented as $2fc$. In this simulation, fl=3.4 GHz and fh=3.6 GHz.

In FIG. 14, impedances in the frequencies fl, fc, and fh of the fundamental wave band are indicated by markers. These impedances concentrate on almost one point. This indicates that a frequency characteristic is small. On the other hand, impedances in the frequencies $2fl$, $2fc$, and $2fh$ of the second harmonic band are also indicated by markers. In tracks of the impedances of the second harmonic, intervals of the markers are considerably wide compared with the fundamental wave band. That is, it is seen that frequency dependency of the impedance in a higher harmonic wave is larger compared with frequency dependency of the impedance in the fundamental wave. This spread of the impedances deviates from the range in which the maximum efficiency can be obtained shown in FIG. 13. Accordingly, there is a problem in that a highly efficient operation cannot be performed over an entire target band. The present disclosure has been made to solve the problems as described above and is directed to providing a high frequency semiconductor amplifier capable of highly efficient power amplification in a wide frequency band.

Solution to Problem

A high frequency semiconductor amplifier according to the present disclosure includes: a transistor formed on a semiconductor substrate and including a gate electrode, a source electrode, and a drain electrode; a matching circuit for input-side fundamental wave matching of the transistor; a first inductor formed on the semiconductor substrate and having one end connected to the gate electrode of the transistor and the other end connected to the matching circuit; a capacitor formed on the semiconductor substrate and having one end being short-circuited; and a second inductor formed on the semiconductor substrate and having one end connected to the gate electrode of the transistor and the other end connected to the other end of the capacitor, wherein the second inductor resonates in series with the capacitor at second harmonic frequency, has a mutual inductance of subtractive polarity with the first inductor, and the first inductor and the second inductor form mutual inductive circuits for input-side second harmonic matching.

Advantageous Effects of Invention

In the present disclosure, it is possible to suppress the spread of the second harmonic impedance viewed from the gate of the transistor and a highly efficient operation can be performed over an entire target band.

DESCRIPTION OF EMBODIMENTS

First Embodiment

A high frequency semiconductor amplifier according to a first embodiment of the present disclosure is explained with reference to FIG. 1 to FIG. 6. Embodiments of the present disclosure are explained below with reference to the drawings.

Figure 1:
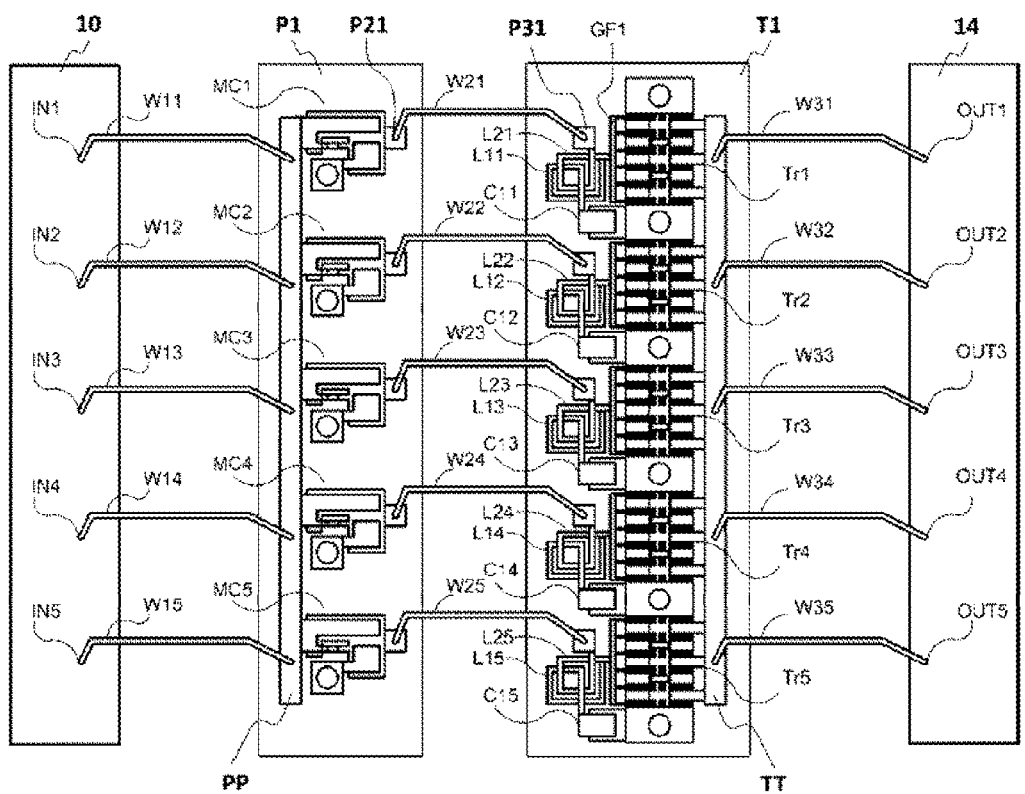
FIG. 1 is a detailed view of the inside of the high frequency semiconductor amplifier according to the first embodiment of the present disclosure viewed from the upper surface.
Figure 11:
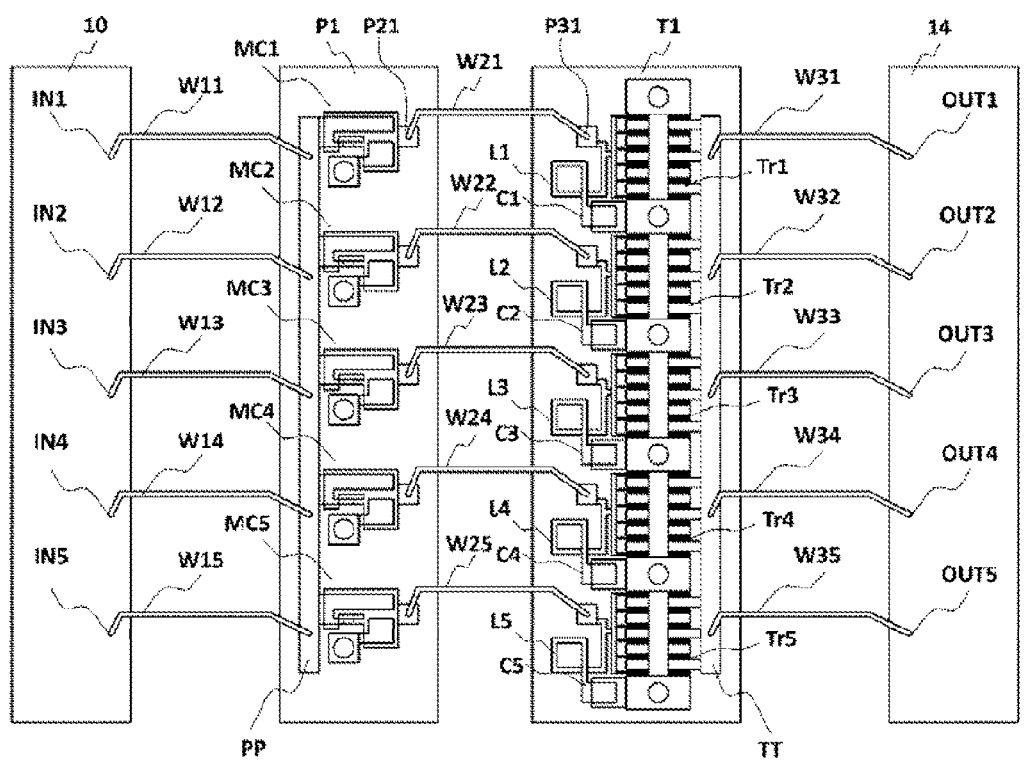
FIG. 11 is a detailed view of the inside of the conventional high frequency semiconductor amplifier viewed from the upper surface.
Figure 12:
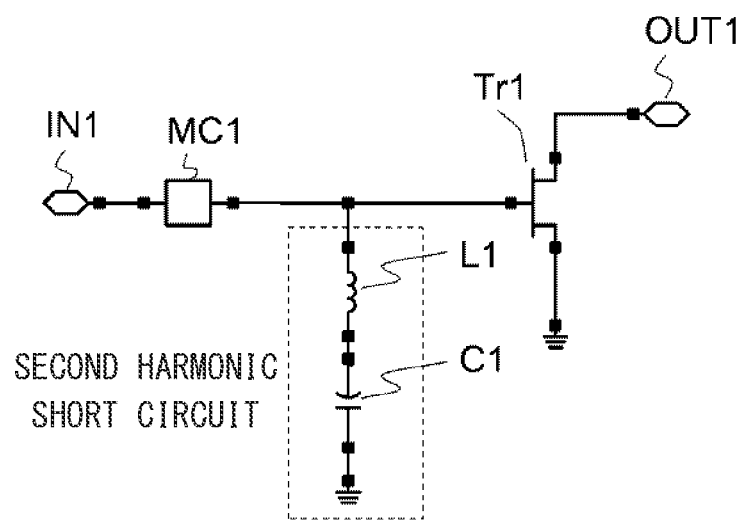
FIG. 12 is an equivalent circuit of a path leading from a connection point IN1 to a connection point OUT1 in FIG. 11.
Figure 13:
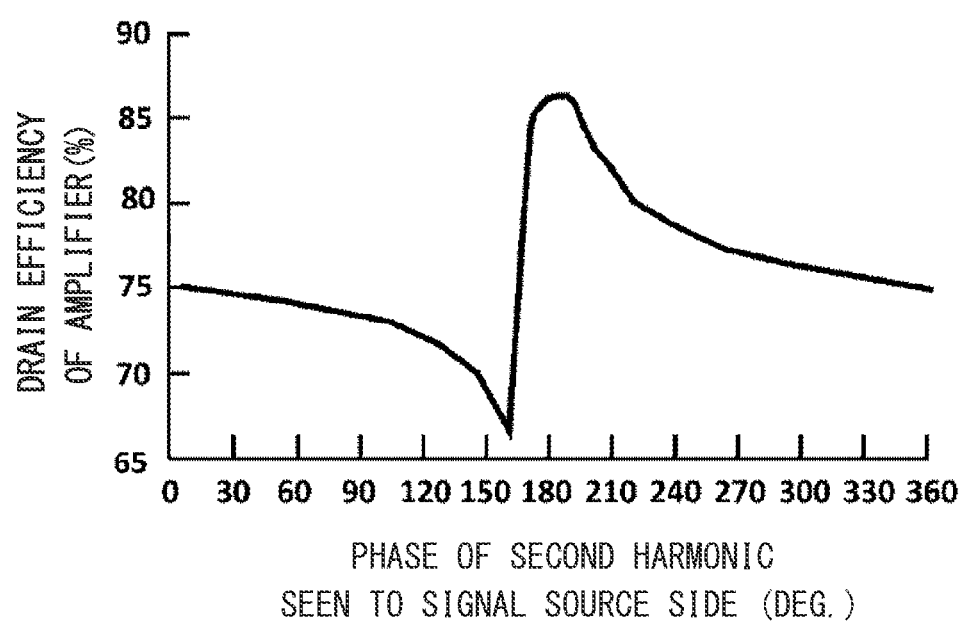
FIG. 13 is a diagram showing input second harmonic reflection phase dependency of drain efficiency.

FIG. 1 is a detailed view of the inside of the high frequency semiconductor amplifier according to the first embodiment of the present disclosure viewed from the upper surface. A major difference from the conventional high frequency semiconductor amplifier explained above with reference to FIG. 11 is that the high frequency semiconductor amplifier includes, on the chip T1, inductors for second harmonic matching L11 to L15 and inductors for fundamental wave circuit L21 to L25 that have mutual inductances of subtractive polarity with one another and form a mutual inductive circuit for input-side second harmonic matching.

As in the conventional high frequency semiconductor amplifier, the chip T1 is a small piece of a semiconductor substrate obtained by epitaxially growing, on the upper surface of a SiC (Silicon Carbide) substrate, a semiconductor layer containing GaN (Gallium Nitride) as a main material. Transistors Tr1 to Tr5 including gate electrodes, source electrodes, and drain electrodes are formed on the upper surface of the chip T1 The transistors are HEMTs (High Electron Mobility Transistors) excellent in a high frequency characteristic. That is, the transistors Tr1 to Tr5 are GaN-based HEMTs. The chip P1 is a chip obtained by forming, on a GaAs substrate, a matching circuit (a circuit for pre-match) that matches input-side fundamental waves of the transistors Tr1 to Tr5.

The inductors for fundamental wave circuit L21 to L25 are formed on the chip T1. One ends of the inductors for fundamental wave circuit L21 to L25 are connected to gate electrodes of the transistors Tr1 to Tr5. The other ends of the inductors for fundamental wave circuit L21 to L25 are connected to, via the wires W21 to W25, matching circuits MC1 to MC5 for input-side fundamental wave matching formed in the chip P1. Capacitors for second harmonic matching C11 to C15 are formed on the chip T1. One ends of the capacitors for second harmonic matching C11 to C15 are short-circuited via VIAs which conduct with the rear surface of the chip T1 and are formed in the chip T1. The inductors for second harmonic matching L1 to L15 are formed on the chip T1. One ends of the inductor for second harmonic matching L11 to L15 are connected to the gate electrodes of the transistors Tr1 to Tr5. The other ends of the inductor for second harmonic matching L11 to L15 are connected to the other ends of the capacitors C11 to C15. That is, the inductors for second harmonic matching L11 to L15, the capacitors for second harmonic matching C11 to C15, and the VIAs are connected in series and configured to resonate in series at a substantially second harmonic frequency and form a second harmonic short circuit.

The inductors for second harmonic matching L11 to L15 and the inductors for fundamental wave circuit L21 to L25 configure spiral inductors, which are spiral transmission lines, such that inductance per unit area can be increased to reduce the area of a semiconductor. The inductors for second harmonic matching L11 to L15 and the inductors for fundamental wave circuit L21 to L25 are positioned to superimpose spirals such that the transmission lines approach in spiral portions and inverse a winding direction of the spirals when viewed from the chip upper surface. Accordingly, the inductors for second harmonic matching L11 to L15 and the inductors for fundamental wave circuit L21 to L25 have mutual inductances of subtractive polarity with one another and form a mutual inductive circuit for input-side second harmonic matching.

Figure 2:
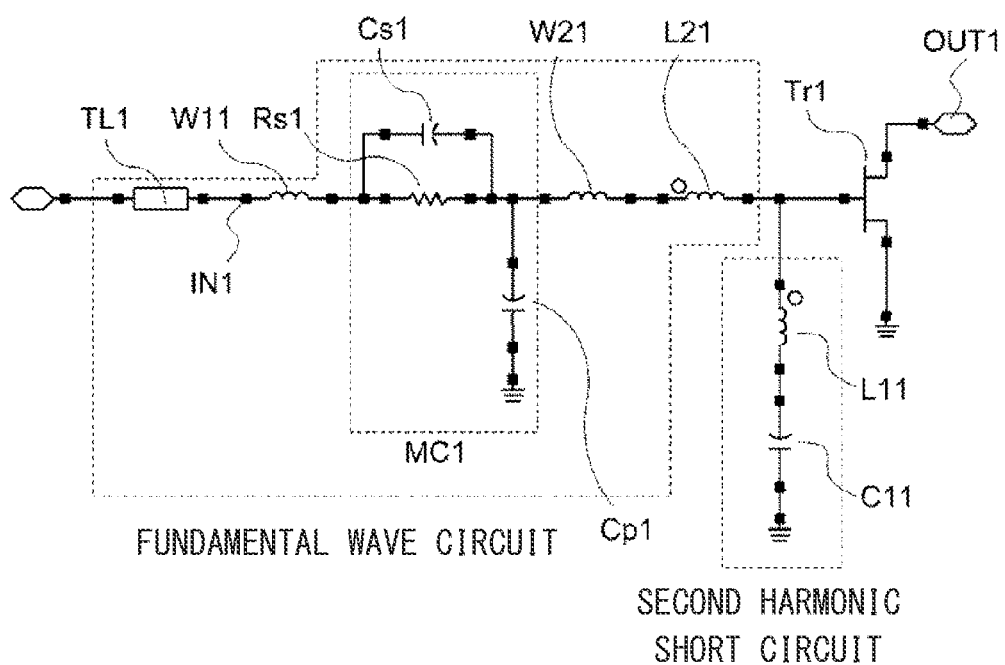
FIG. 2 is an equivalent circuit of a path leading from the connection point IN1 to the connection point OUT1 in FIG. 1.

FIG. 2 is an equivalent circuit of a path leading from the connection point IN1 to the connection point OUT1 in FIG. 1 and is an extraction of a part of the high frequency semiconductor amplifier according to the first embodiment of the present disclosure. As explained above, the inductor for second harmonic matching L11 and the capacitor for second harmonic matching C11 are connected in series. One end of the capacitor for second harmonic matching C11 is grounded. An inductance value of the inductor for second harmonic matching L11 and a capacitance value of the capacitor for second harmonic matching C11 are set such that the inductor for second harmonic matching L11 and the capacitor for second harmonic matching C11 resonate at a second harmonic frequency and are substantially short-circuited. Note that the short circuit ideally has 0Ω. However, it should be noted that, practically, if the impedance of the second harmonic short circuit is set to ⅕ or less compared with the impedance of the fundamental wave, there is a certain or more effect for the efficiency improvement.

The inductor for second harmonic matching L11 and the inductor for fundamental wave circuit L21 form a mutual inductive circuit for input-side second harmonic matching. That is, the inductor for second harmonic matching L11 and the inductor for fundamental wave circuit L21 are positioned to have mutual inductances of subtractive polarity when electric power is simultaneously input to the inductor for fundamental wave circuit L21 and the inductor for second harmonic matching L11 from gates.

The inductor for fundamental wave circuit L21 is connected to one end of the wire W21. A shunt-connected capacitor Cp1 and a capacitor Cs1 and a resistor Rs1 connected in parallel are connected to the other end of the wire W21. The capacitors Cp1 and Cs1 and the resistor Rs1 are formed on the chip P1 and configure the matching circuit MC1. The resistor Rs1 is used for the purpose of improving stability of operation at a frequency lower than the frequency of the fundamental wave. The capacitor Cs1 is used for the purpose of reducing a resistance value in the fundamental wave. The capacitor Cp1 and the inductor for fundamental wave circuit L21 and the wire W21 operate as a pre-match circuit for the fundamental wave on the input side. A transmission line TL1 outside a package operates as an impedance converter.

Figure 3A:
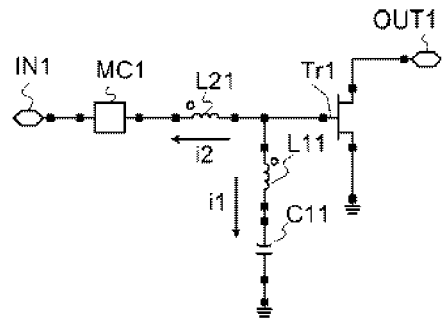
FIG. 3 is an equivalent circuit diagram for explaining operation of the present disclosure.

FIG. 3 is an equivalent circuit diagram for explaining operation of the present disclosure. FIG. 3A is an equivalent circuit of the path leading from the connection point IN1 to the connection point OUT1 in FIG. 1. Only portions necessary for explanation of FIG. 2 are schematically shown in FIG. 3A. As explained above, the inductor for fundamental wave circuit L21 and the inductor for second harmonic L11 form a mutual inductive circuit for input-side second harmonic matching and have mutual inductances of subtractive polarity each other. The mutual inductances of subtractive polarity are indicated by dots of L11 and L21. An electric current flowing to the inductor for second harmonic L11 is represented as i1. An electric current. flowing to the inductor for fundamental wave circuit L21 is represented as i2. An inductance value of L11 is represented as L(L11), an inductance value of L21 is represented as L(L21), and a mutual inductance value is represented as −M.

Figure 3B:
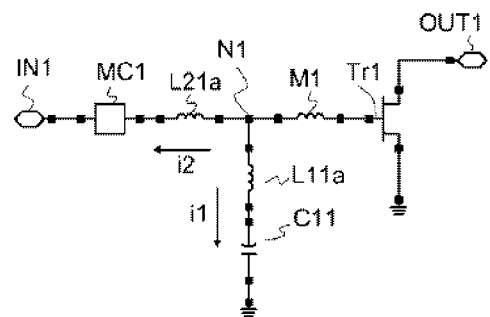
Figure 3C:
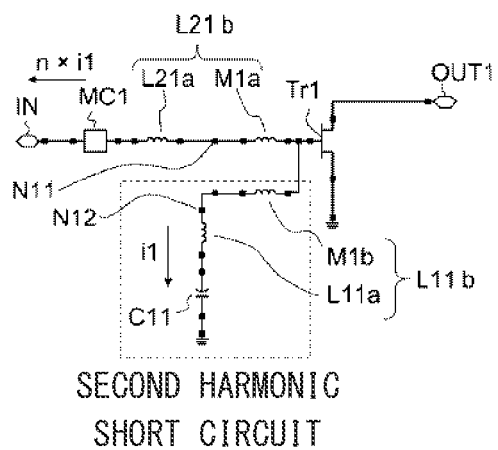

FIG. 3B is an equivalent circuit diagram in the case in which the inductors in FIG. 3A are replaced with inductors without couplings. An inductance value of a fundamental wave inductor L21a is represented as L(L21)+M, an inductance value of a second harmonic inductor L11a is represented as L(L11)+M, and an inductance value of an inductor M1 is represented as −M. As it is evident from FIG. 3B, both of the electric current i1 and the electric current i2 flow to the inductor M1. As shown in FIG. 3C, it is considered that the inductor M1 is imaginarily divided into an inductor M1b to which only the electric current i1 flows and an inductor M1a to which only the electric current i2 flows. In FIG. 3C, if a series connection of the inductor L21a and the inductor M1a is an inductor L21b and a series connection of the inductor L11a and the inductor M1b is an inductor L11b, it is seen from comparison of FIG. 3A and FIG. 3C that L21b and L11b in FIG. 3C are equivalent to L21 and L11 in FIG. 3A.

If an inductance value of the inductor M1a is represented as L(M1a) and an inductance value of the inductor LM1b is represented as L(M1b), since a node N1 in FIG. 3B and nodes N11 and N12 in FIG. 3C have the same potential, L(M1a) and L(M1b) can be represented as follows using i1, i2, and M;

$$L(M1a) = -(i1+i2)/i2 \times M, \text{ and}$$

$$L(M1b) = -(i1+i2)/i1 \times M.$$

It n=i2/i1, L(M1a) and L(M1b) described above can be represented as follows using n;

$$L(M1a) = -(1+1/n) \times M, \text{ and}$$

$$L(M1b) = -(1+n) \times M.$$

Then, since the electric current i2 flowing to the fundamental wave inductor side can be represented as nxi1 using n, an inductance value L(L21b) of the fundamental wave inductor L21b in FIG. 3(c) can be represented as L(L21b)=L(L21a)+L(M1a)=L(L21)−(1/n)×M and an inductance value L(L11b) of the second harmonic inductance inductor L11b can be represented as L(L11b)=L(L11a)+L(M1b)=L(L11)−n×M.

Figure 4:
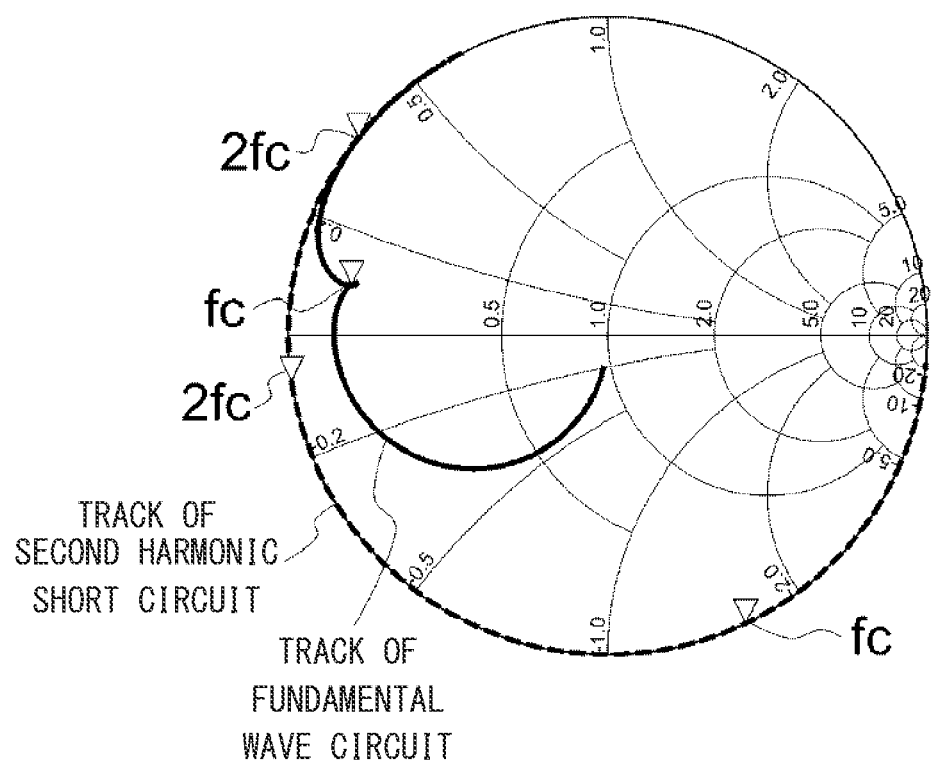
FIG. 4 is a diagram showing frequency dependency of impedances of a fundamental wave circuit and a second harmonic short circuit in FIG. 2.

FIG. 4 is a diagram showing frequency dependency of impedances of a fundamental wave circuit and a second harmonic short circuit viewed from the gates of the transistor Tr1 in FIG. 2. In FIG. 4, a solid line indicates the impedance of the fundamental wave circuit and a broken line indicates the impedance of the second harmonic short circuit. However, if the inductor for fundamental wave circuit L21 and the inductor for second harmonic matching L1 have mutual inductances, since impedance calculation in the fundamental wave circuit and the second harmonic short circuit alone cannot be performed, calculation is carried out in a state in which the mutual impedances are absent. Accordingly, although there is a slight difference from FIG. 2, a rough movement of circuit impedance can be grasped.

Figure 5A:
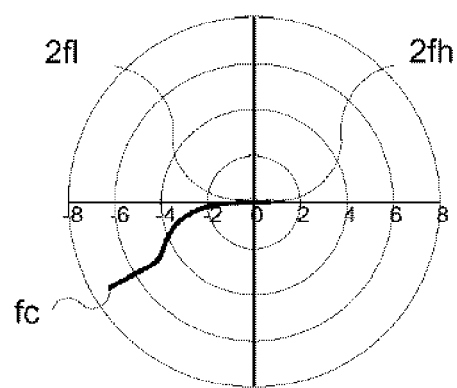
FIG. 5 is a diagram showing frequency dependency of n.
Figure 5B:
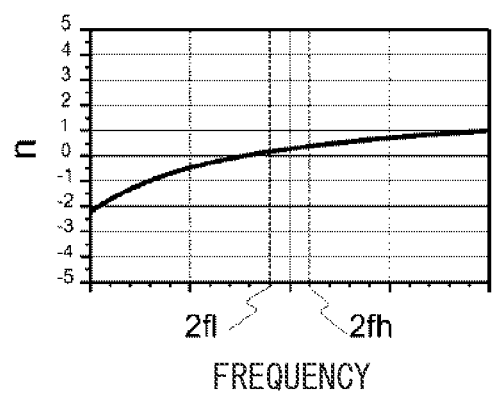

FIG. 5 is a diagram showing frequency dependency of n. FIG. 5A is a diagram showing a track on a polar coordinate of n. FIG. 5B is a diagram showing a frequency characteristic of a real part of n near a second harmonic frequency. In FIG. 5A, a position of n at fc is shown. When a high frequency current flowing from the gates of the transistor to the fundamental wave matching circuit and a high frequency current flowing from the gates of the transistor to the second harmonic short circuit in the fundamental wave are compared, since the impedance of the second harmonic short circuit is high and an electric current hardly flows as shown in FIG. 4, a value of n is large. In the fundamental wave, impedance expecting the, fundamental wave matching circuit is inductive and impedance expecting the second harmonic short circuit is capacitive. Therefore, a sign of the real part of n is negative.

On the other hand, as shown in FIG. 4, the capacitive impedance of the second harmonic short circuit decreases and a high-frequency current flowing from the gates of the transistor to the second harmonic short circuit increases as the frequency increases from the fundamental wave and approaches the second harmonic. The impedance of the second harmonic short circuit is minimized at a resonance frequency of the second harmonic short circuit. If the impedance exceeds the second harmonic, the impedance becomes inductive and the absolute value of the impedance increases. Accordingly, as shown in FIG. 5A, a track of n passes near zero from a negative value and moves in a positive direction as the frequency rises.

Near the second harmonic frequency, an imaginary part of n is substantially absent as shown in FIG. 5(a). As shown in FIG. 5(b), a real part of n monotonously increases with respect to the frequency. Accordingly, the inductance value L (L11b) at the upper limit (2fh) of the band is small with respect to the inductance value L (L11b) at the lower limit (2fl) of the band. Accordingly, a resonance frequency by L11b and C11 is low at the lower limit (2fl) of the band and high at the upper limit (2fh) of the band. That is, a phase change of a reflection coefficient of the impedance of the second harmonic expected from the gates of the transistor is suppressed. Note that, as in the above explanation, fl=3.4 GHz and fh=3.6 GHz.

Figure 6:
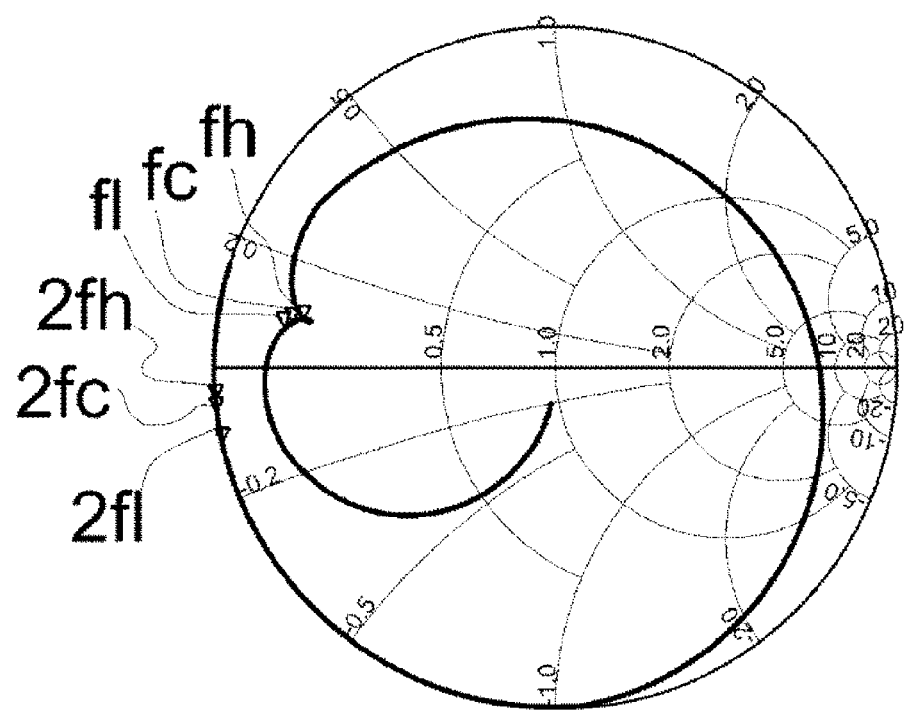
FIG. 6 is a diagram showing a track of an input-side impedance in the high frequency semiconductor amplifier according to the first embodiment of the present disclosure.
Figure 14:
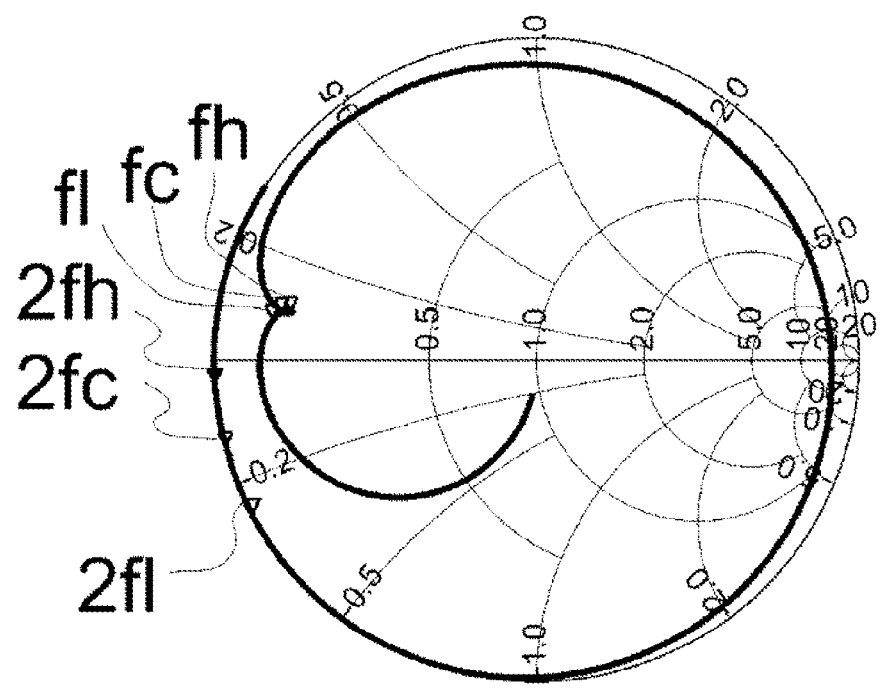
FIG. 14 is a diagram showing a track of input-side impedance in the conventional high frequency semiconductor amplifier.

FIG. 6 is a diagram showing a track of an input-side impedance in the high frequency semiconductor amplifier according to the first embodiment of the present disclosure. It is seen that an interval of impedances at 2fl and 2fh shown in FIG. 6 is narrower compared with the intervals of the impedances at 2fl and 2fh shown in FIG. 14. This indicates that phase changes of impedances in a second harmonic are close and a frequency band in which high efficiency can be maintained is extended.

As explained above, the semiconductor device in the first embodiment of the present disclosure includes the transistor Tr1 formed on the semiconductor substrate T1 and including the gate electrodes, the source electrodes, and the drain electrodes, the matching circuit MC1 for input-side fundamental wave matching of the transistor Tr1, the first inductor L21 formed on the semiconductor substrate T1, one end of the first inductor L21 being connected to the gate electrodes of the transistor Tr1 and the other end of the first inductor L21 being connected to the matching circuit MC1, the capacitor C11 formed on the semiconductor substrate T1, one end of the capacitor C11 being short-circuited, and the second inductor L11 formed on the semiconductor substrate T1, one end of the second inductor L11 being connected to the gate electrodes of the transistor Tr1 and the other end of the second inductor L11 being connected to the other end of the capacitor C11. The second inductor L11 resonates in series with the capacitor C11 at the second harmonic frequency, has the mutual inductances of subtractive polarity with the first inductor L21, and forms the mutual inductive circuit for input-side second harmonic matching.

With such a configuration, since the gate electrodes of the transistor Tr1 and the matching circuit MC1 for fundamental wave matching are connected via the first inductor L21 that has the mutual inductances of subtractive polarity with the second inductor L11 configuring the resonance circuit, there is an effect that it is possible to suppress the spread of the second harmonic impedance viewed from the gates of the transistor Tr1 and a highly efficient operation can be performed over an entire target band.

Note that, in the first embodiment, an example of the circuit that can realize desired n is explained. However, there is no limitation on a circuit configuration if a circuit call realize a that moves from a negative value in a positive direction according to an increase in a frequency.

Second Embodiment

The configuration of a high frequency semiconductor amplifier according to a second embodiment of the present disclosure is explained with reference to FIGS. 7 and 8. A difference from the first embodiment is the configurations of a first inductor and a second inductor. The other portions are common to the first embodiment.

In the high frequency semiconductor amplifier according to the first embodiment shown in FIG. 1, the mutual inductive circuit for input-side second harmonic matching including the inductor for second harmonic matching L11 and the inductor for fundamental wave circuit L21 is in close contact with a gate feeder wire GF1. Therefore, when an operating frequency increases, influences on basic transistors configuring the transistor Tr1 become imbalance. Specifically, in FIG. 1, in a downward direction viewed from a connection point of the gate feeder wire GF1 and the inductor for second harmonic matching L11, the distance between the gate feeder wire GF1 and the inductor for second harmonic matching L11 is short and coupling occurs. On the other hand, in FIG. 1, in an upward direction viewed from the connection point of the gate feeder wire GF1 and the inductor L11, the distance between the gate feeder wire GF11 and the inductor for second harmonic matching L11 is long compared with the distance in the downward direction and the influence of coupling is small. Since the distances between the mutual inductive circuit for input-side second harmonic matching and the basic transistors are not uniform in this way, there is a problem in that the operation of the transistor Tr1 becomes imbalance and characteristics are deteriorated.

Figure 7:
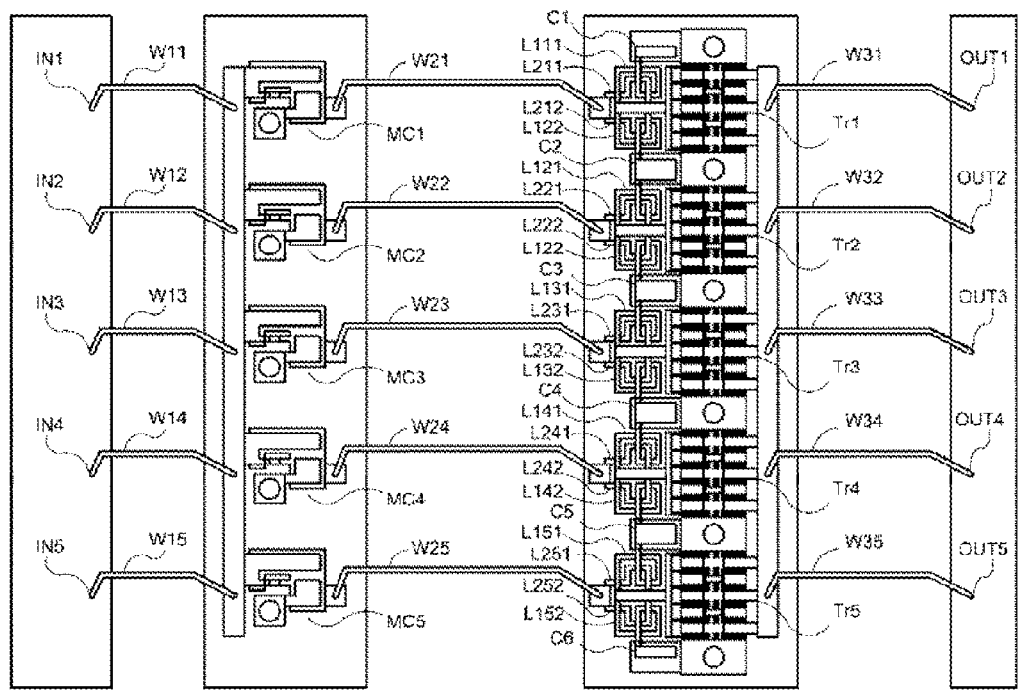
FIG. 7 is a detailed view of the inside of the high frequency semiconductor amplifier according to the second embodiment of the present disclosure viewed from the upper surface.

FIG. 7 is a detailed view of the inside of the high frequency semiconductor amplifier according to the second embodiment of the present disclosure viewed from the upper surface. FIG. 8 is an enlarged view of the vicinity of Tr2 in FIG. 7. A path leading from a connection point IN2 to a connection point OUT2 is explained as an example.

As in the first embodiment, the chip T1 is a small piece of a semiconductor substrate obtained by epitaxially growing, on the upper surface of a SiC (Silicon Carbide) substrate, a semiconductor layer containing GaN (Gallium Nitride) as a main material. The transistors Tr1 to Tr5 including the gate electrodes, the source electrodes, and the drain electrodes are formed on the upper surface of the chip T1. This transistor is a HEMT (High Electron Mobility Transistor) excellent in a high frequency characteristic. That is, the transistors Tr1 to Tr5 are GaN-based HEMTs. The capacitors for second harmonic matching C11 to C15 are formed on the chip T1. One ends of the capacitors for second harmonic matching C1 to C6 are short-circuited via the VIAs which conduct with the rear surface of the chip T1 and are formed in the chip T1. Gate electrodes of the transistor Tr2 are connected to one another by a gate feeder wire GF2.

One end of an inductor for second harmonic matching L121 is connected to the gate electrodes of the transistor Tr2 and the other end of the inductor for second harmonic matching L121 is connected to the other end of the capacitor for second harmonic matching C2. The inductor for second harmonic matching L121 and the capacitor for second harmonic matching C2 are configured to resonate at a substantially second harmonic frequency and form a second harmonic short circuit. One end of an inductor for second harmonic matching L122 is connected to the gate electrodes of the transistor Tr2 and the other end of the inductor for second harmonic matching L122 is connected to the other end of the capacitor for second harmonic matching C3. The inductor for second harmonic matching L122 and the capacitor for second harmonic matching C3 are configured to resonate at a substantially second harmonic frequency and form a second harmonic short circuit.

One end of an inductor for fundamental wave circuit L221 is connected to the gate electrodes of the transistor Tr2 and the other end of the inductor for fundamental wave circuit L221 is connected to the matching circuit MC2 for fundamental wave matching via a wire W22. One end of an inductor fundamental wave circuit L222 is connected to the gate electrodes of the transistor Tr2 and the other end of the inductor for fundamental wave circuit L222 is connected to the matching circuit MC2 for fundamental wave matching via the wire W22.

Figure 8:
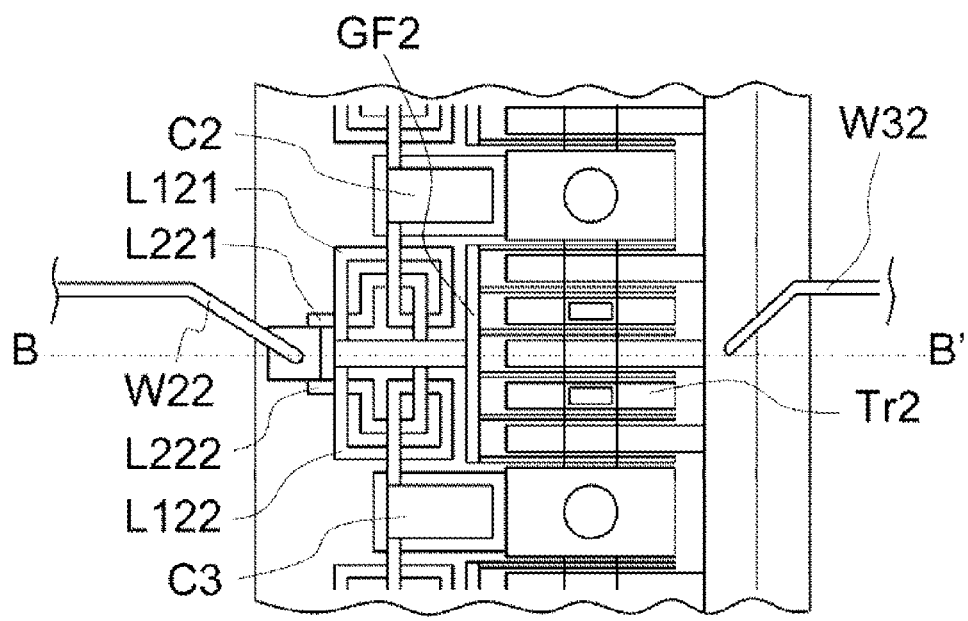
FIG. 8 is an enlarged view of the vicinity of Tr2 in FIG. 7.
Figure 9:
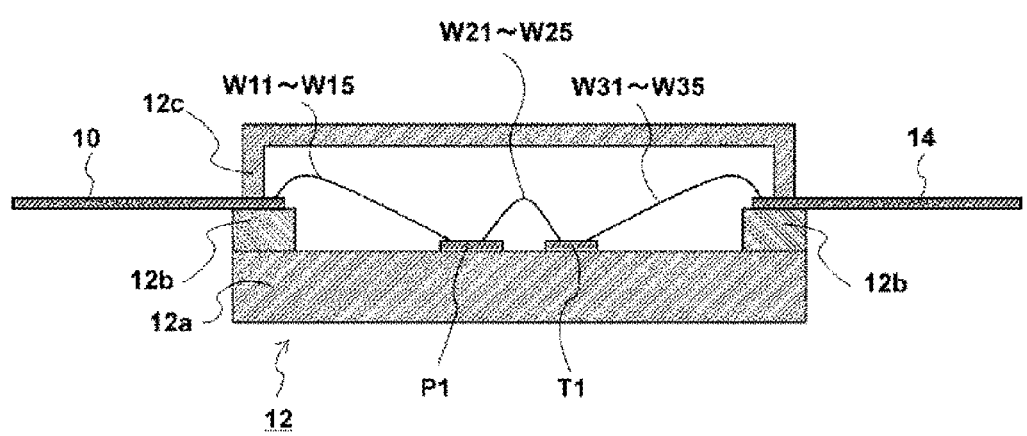
FIG. 9 is a sectional view of the conventional high frequency semiconductor amplifier.
Figure 10:
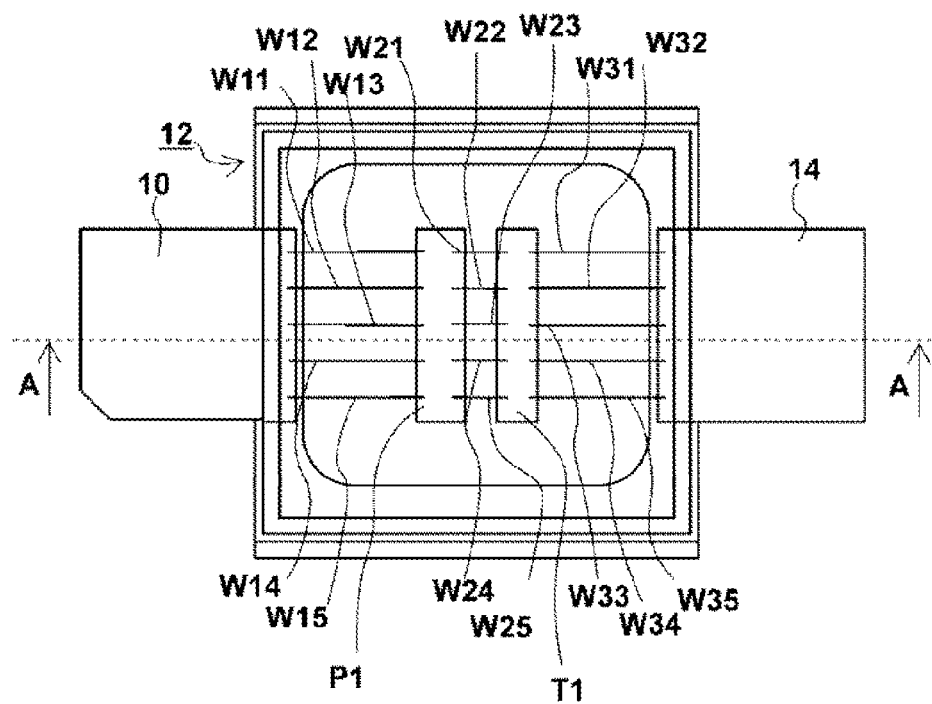
FIG. 10 is a top view of the conventional high frequency semiconductor amplifier.

As shown in FIGS. 7 and 8, the inductor for second harmonic matching L121 and the inductor for fundamental wave circuit L221 are positioned close to each other in an interlaced form. The placement is devised such that a path leading from the gates of the transistor Tr2 to C2 along the inductor for second harmonic matching L121 and a path leading from the gates of the transistor Tr2 to the wire W22 along the inductor for fundamental wave circuit L221 face opposite directions each other in close contact portions. Accordingly, the inductor for second harmonic matching L121 and the inductor for fundamental wave circuit L221 have mutual inductances of subtractive polarity and form a mutual inductive circuit for input-side second harmonic matching. Similarly, the inductor for second harmonic matching L122 and the inductor for fundamental wave circuit L222 have mutual inductances of subtractive polarity and form a mutual inductive circuit for input-side second harmonic matching.

In the mutual inductive circuit for input-side second harmonic matching including the inductor for second harmonic matching L121 and the inductor for fundamental wave circuit L221 and the mutual inductive circuit for input-side second harmonic matching including the inductor for second harmonic matching L122 and the inductor for fundamental wave circuit L222, the inductors for second harmonic matching L121 and L122 are connected and the inductors for fundamental wave circuit L221 and L222 are connected. That is, a pair of mutual inductive circuits for input-side second harmonic matching is connected to each other. The mutual inductive circuit for input-side second harmonic matching including; the inductor for second harmonic matching L121 and the inductor for fundamental wave circuit L221 and the mutual inductive circuit for input-side second harmonic matching including the inductor for second harmonic matching L122 and the inductor for fundamental wave circuit L222 are symmetrically disposed with respect to a straight line B-B' passing the center of the transistor Tr2 with respect to the length direction of the gates and extending in the gate width direction. That is, the pair of mutual inductive circuits for input-side second harmonic matching are symmetrically disposed with respect to the straight line extending in the gate width direction.

The inductors for second harmonic matching L121 and L122 are in close contact with the gate feeder wire GF2. However, since the inductors for second harmonic matching L121 and L122 are disposed symmetrically with respect to the straight line B-B', compared with the first embodiment, differences among the distances between the basic transistors and the inductors are small. Accordingly, compared with the first embodiment, imbalance of the operations among the basic transistors can be suppressed. Characteristics of the high frequency semiconductor amplifier are improved. Explanation about the other portions is omitted.

As explained above, the high frequency semiconductor amplifier according to the second embodiment of the present disclosure includes the transistor Tr2 formed on the semiconductor substrate T1 and including the gate electrodes, the source electrodes, and the drain electrodes, the matching circuit MC2 for input-side fundamental wave matching of the transistor Tr2, the first inductors L221 and L222 formed on the semiconductor substrate T1, one ends of the first inductors L221 and L222 being connected to the gate electrodes of the transistor Tr2 and the other ends of the first inductors L221 L222 being connected to the matching circuit MC2, and the capacitors C2 and C3 formed on the semiconductor substrate T1, one ends of the capacitors C2 and C3 being short-circuited. The high frequency semiconductor amplifier according to the second embodiment of the present disclosure includes the second inductor L121 formed on the semiconductor substrate T1, one end of the second inductor L121 being connected to the gate electrodes of the transistor Tr2 and the other end of the second inductor L121 being connected to the other end of the capacitor C2. The second inductor L121 resonates in series with the capacitor C2 at the second harmonic frequency, has the mutual inductances of subtractive polarity with the first inductor L221, and forms the mutual inductive circuit for input-side second harmonic matching. Further, the high frequency semiconductor amplifier according to the second embodiment of the present disclosure includes the second inductor L122 formed on the semiconductor substrate T1, one end of the second inductor L122 being connected to the gate electrodes of the transistor Tr2 and the other end of the second inductor L122 being connected to the other end of the capacitor C3. The second inductor L122 resonates in series with the capacitor C2 at the second harmonic frequency, has the mutual inductances of subtractive polarity with the first inductor L222, and forms the mutual inductive circuit for input-side second harmonic matching.

In addition, in the high frequency semiconductor amplifier according to the second embodiment of the present disclosure, the inductor L121 and the inductor L122 are connected to each other and the inductor L221 and the inductor L222 are connected to each other. The inductor L121 and the inductor L122 are symmetrically disposed with respect to a straight line extending in the width direction of the gates. The inductor L221 and the inductor L222 are symmetrically disposed with respect to the straight line extending in the width direction of the gates. That is, the pair of mutual inductive circuits for input-side second harmonic matching are symmetrically disposed with respect to the straight line extending in the width direction of the gates and are connected to each other.

With such a configuration, as in the high frequency semiconductor amplifier explained in the first embodiment, in the semiconductor device according to the second embodiment, since the gate electrodes of the transistor Tr2 and the matching circuit MC2 for fundamental wave matching are connected via the first inductors L221 and L222 that have the mutual inductances of subtractive polarity with second inductors L121 and L122 configuring the resonance circuit, there is an effect that it is possible to suppress the spread of the second harmonic impedance viewed from the gates of the transistor Tr2 and a highly efficient operation can be performed over an entire target band.

Further, in the high frequency semiconductor amplifier according to the second embodiment, the pair of mutual inductive circuits for input-side second harmonic matching are symmetrically disposed with respect to the straight line B-B' passing the center with respect to the length direction of the gates of the transistor Tr2 and extending in the gate width direction. Accordingly, compared with the first embodiment, the differences among the distances between the basic transistors and the inductors can be reduced. Therefore, compared with the first embodiment, there is an effect that it is possible to suppress imbalance of operations among the basic transistors and further improve characteristics of the high frequency semiconductor amplifier.

Note that, in this specification, in the entire high frequency semiconductor amplifier according to the present disclosure or the entire conventional high frequency semiconductor amplifier, the operation and the configuration of the high frequency semiconductor amplifier are explained using the path leading from the connection point IN1 to the connection point OUT1 or the path leading from the connection point IN2 to the connection point OUT2. However, the operation and the configuration of the high frequency semiconductor amplifier are the same in a path leading from a connection point INx to a connection point OUTx (x is any one of integers 1 to 5). In the embodiments of the present disclosure, the transistors are the GaN-based HFMTs formed on the SiC substrate. However, a substrate material may be Si or the like. Alternatively, the transistors may be made of a GaAs-based or a Si-based material The transistor structure may be a MOSFET, a MESFET, or an HBT. In the present disclosure, the embodiments can be freely combined within the scope of the disclosure and the embodiments can be modified or omitted as appropriate.

REFERENCE SIGNS LIST 10, 14 lead; 12 package; 12a metal plate; 12b insulator; 12c cap; C1~C5, C11~C15 capacitor for second harmonic matching; L1 to L5, L11 to L15, L111 to L152 inductor for second harmonic matching; L21 to L25, L211 to L252 inductor for fundamental wave circuit; MC1 to MC5 matching circuit; T1 chip; Tr1 to Tr5 transistor; W11 to W15, W21 to W30, W31 to W35 wire

The invention claimed is:

1. A high frequency semiconductor amplifier comprising:
a transistor formed on a semiconductor substrate and including a gate electrode, a source electrode, and a drain electrode;
a matching circuit for input-side fundamental wave matching of the transistor;
a first inductor formed on the semiconductor substrate and having one end connected to the gate electrode of the transistor and the other end connected to the matching circuit;
a capacitor formed on the semiconductor substrate and having one end being short-circuited; and
a second inductor formed on the semiconductor substrate and having one end connected to the gate electrode of the transistor and the other end connected to the other end of the capacitor,
wherein the second inductor resonates in series with the capacitor at second harmonic frequency, has a mutual inductance of subtractive polarity with the first inductor, and
the first inductor and the second inductor form a mutual inductive circuit for input-side second harmonic matching.

2. The high frequency semiconductor amplifier according to claim 1, wherein the mutual inductive circuit for input-side second harmonic matching is symmetrically disposed with respect to a straight line extending in a gate width direction.

3. The high frequency semiconductor amplifier according to claim 1, wherein the transistor is a GaN-based HEMT.

4. The high frequency semiconductor amplifier according to claim 2, wherein the transistor is a GaN-based HEMT.

5. The high frequency semiconductor amplifier according to claim 1, wherein
the matching circuit is configured to match a fundamental wave at an input side of the transistor,
the first inductor is separate from the matching circuit, and
the mutual inductive circuit for input-side second harmonic matching is configured to match a second harmonic at the input side of the transistor.

* * * * *